(12) United States Patent
Barstad et al.

(10) Patent No.: US 6,444,110 B2
(45) Date of Patent: *Sep. 3, 2002

(54) ELECTROLYTIC COPPER PLATING METHOD

(75) Inventors: Leon R. Barstad, Raynham, MA (US); James E. Rychwalski, Medway, MA (US); Mark Lefebvre, Hudson, NH (US); Stephane Menard, Lyons (FR); James L. Martin, Merrick, NY (US); Robert A. Schetty, III, Salonga, NY (US); Michael Toben, Smithtown, NY (US)

(73) Assignee: Shipley Company, L.L.C., Marlborough, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/313,045

(22) Filed: May 17, 1999

(51) Int. Cl.[7] .................. C25D 5/02; H01L 21/288; H01L 21/445
(52) U.S. Cl. .............. 205/123; 205/125; 205/291; 205/296
(58) Field of Search .................. 205/291, 296, 205/298, 125, 123, 161; 106/1.18

(56) References Cited

U.S. PATENT DOCUMENTS

| | | | |
|---|---|---|---|
| 2,424,887 A | * 7/1947 | Henricks | 205/296 |
| 3,770,598 A | 11/1973 | Creutz | |
| 3,784,454 A | 1/1974 | Lyde | |
| 3,876,513 A | 4/1975 | Brown et al. | |
| 4,036,710 A | * 7/1977 | Kardos et al. | 205/298 |
| 4,098,656 A | 7/1978 | Deuber | |
| 4,336,114 A | * 6/1982 | Mayer et al. | 205/298 |
| 4,347,108 A | * 8/1982 | Willis | 205/298 |
| 4,530,741 A | 7/1985 | Rosenberg | |
| 4,913,787 A | 4/1990 | Kiso | |
| 5,051,154 A | * 9/1991 | Bernards et al. | 205/125 |
| 5,068,013 A | * 11/1991 | Bernards et al. | 205/125 |
| 5,151,170 A | * 9/1992 | Montgomery et al. | 205/298 |
| 5,174,886 A | 12/1992 | King et al. | |
| 5,223,118 A | 6/1993 | Sonnenberg et al. | |
| 5,252,196 A | 10/1993 | Sonnenberg et al. | |
| 5,433,840 A | * 7/1995 | Dahms et al. | 205/296 |
| 5,858,870 A | 1/1999 | Zheng et al. | |
| 6,024,857 A | * 2/2000 | Reid | 205/123 |
| 6,113,771 A | * 9/2000 | Landau et al. | 205/123 |

OTHER PUBLICATIONS

Shipley Advance Interconnect, Advanced Interconnect Materials, "Nanoplate™ Copper Plating Electrolyte Optimized for 200 nm, Bottom–up Trench Fill" Shipley Company, L.L.C. data sheet. No Date Available.

* cited by examiner

Primary Examiner—Nam Nguyen
Assistant Examiner—Wesley A. Nicolas
(74) Attorney, Agent, or Firm—Peter F. Corless; S. Matthew Cairns; Darryl P. Frickey

(57) ABSTRACT

The present invention provides methods for the use of copper electroplating compositions. Electroplating compositions of the invention contain an increased brightener concentration that can provide effective copper plate on difficult-to-plate aperture walls, including high aspect ratio, small diameter microvias.

46 Claims, No Drawings

ELECTROLYTIC COPPER PLATING METHOD

BACKGROUND OF THE INVENTION

1. Field of the Invention

The present invention relates to copper electroplating solutions, methods for using the solutions and products formed by using such methods and solutions. More particularly, the invention provides electrolytic copper plating solutions that have increased brightener levels and use of same for effective plating of high aspect ratio apertures, e.g. microvias with aspect ratios of at least 4:1 and diameters of 200 nm or smaller.

2. Background

Electroplating articles with copper coatings is generally well known in the industry. Electroplating methods involve passing a current between two electrodes in a plating solution where one electrode is the article to be plated. A common plating solution would be an acid copper plating solution containing (1) a dissolved copper salt (such as copper sulfate), (2) an acidic electrolyte (such as sulfuric acid) in an amount sufficient to impart conductivity to the bath and (3) additives (such as surfactants, brighteners, levelers and suppressants) to enhance the effectiveness and quality of plating. See generally U.S. Pat. Nos. 5,068,013; 5,174,886; 5,051,154; 3,876,513; and 5,068,013 for a discussion of copper plating baths.

Over time, a number of improvements in electroplating techniques have been made as the articles to be plated evolved in degree of difficulty and standards for plating increased. However, even with the improvements in electroplating techniques, circumstances exist that can lead to plating defects.

Copper plating technology has been particularly important in the manufacture of computer circuit boards. More specifically, during circuit board manufacture, copper electrical connections are provided between various board layers by plating board through holes whereby a thin conductive copper conductive is first applied, typically using electroless copper plating techniques, followed by electroplating copper from acid copper solutions.

Copper plating is also employed in circuit board manufacture to plate outer layers where final circuitry is defined. For such applications, panel plating is typically employed, where the full circuit board surface is copper plated followed by photodefining circuitry with a photoresist and then etching in a subtractive process. Alternatively an additive process can be employed, where copper circuits are produced by plating between lines defined by a resist relief image.

More recently, copper plating also has been employed in semiconductor chip manufacture to provide chip interconnections. Traditionally, semiconductors have been interconnected through aluminum conductors. However, industry continually demands enhanced performance, including ultra large-scale integration and faster circuits. Consequently, chip interconnects are required at dimensions of 200 nm and less. At such geometries, the resistivity of aluminum (theoretically $2.65 \times 10^{-8}$ ohm/meter at room temperature) is considered too high to allow the electronic signal to pass at required speeds. Copper, with a theoretical resistivity of $1.678 \times 10^{-8}$ ohm/meter, is considered a more suitable material to meet the next generation of semiconductor microchips.

Typical processes for defining semiconductor chip interconnects, particularly aluminum interconnects, have involved reactive ion etching of metal layers, e.g. a process that includes metal deposition, photolithographic patterning, line definition through reactive ion etching and dielectric deposition. However, in Cu-based systems, reactive ion etching is not practical as a result of the paucity of copper compounds with vapor pressures sufficient to enable removal of the copper as may be desired.

Consequently, alternative strategies have developed, such as the Damascene process. That process starts with deposition of dielectric typically by chemical vapor deposition of silicon materials or organic dielectrics followed by curing, or spin coating silicon materials or organic dielectrics. Patterning by photolithographic processes and reactive ion etching defines the vias and trenches (interconnects) in the dielectric. Barrier layers are then formed by chemical vapor deposition or other methods to isolate the copper lines from the dielectric. Copper is then deposited and excess material removed by chemical or mechanical polishing processes.

Although conventional copper plating systems can be suitable for plating vias and trenches as small as 300 nm with 4:1 aspect ratios, defects such as seams, voids and inclusions can occur with conventional methods when attempting to plate features that are smaller or have higher aspect ratios. Such defects can occur as a result of conformal copper plating, i.e. where all targeted surfaces are plated at the same rate such that the sidewalls of a via or trench plate together forming a seam or a demarcation of disruption where the copper grains are separated and will not anneal to form a continuous copper wire. Defects also will occur at the top rim of a via hole, where electronic charge density can concentrate and result in rapid copper growth that closes off the via before the via is filled sufficiently with metal. Such inadequate metal fill can result in inclusion and voids, disrupting the ability of the plated metal to carry a coherent signal.

It thus would be desirable to have new electroplating compositions. It would be particularly desirable to have new copper electroplating compositions that can plate effectively (e.g. absence of voids, inclusions and seams) high aspect ratio apertures, including high aspect ratio microvias as discussed above.

SUMMARY OF THE INVENTION

We have now found copper electroplating compositions that effectively plate a wide variety of articles, including printed circuit boards and other electronic packaging devices. Compositions and methods of the invention are particularly useful for filling microvias and trenches required by current and anticipated semiconductor fabrication requirements (including microvias having aspect ratios of at least 4:1 and diameters of 200 nm or less) by reliably plating copper deposits that are essentially or completely free of voids, inclusions or other plating imperfections.

Electroplating baths of the invention are characterized in significant part by comprising enhanced brightener concentrations. Without being bound by any theory, it is believed that the higher brightener concentrations can accelerate the plating rate in recesses and microvias as carrier molecules become incorporated into the plating deposit. This is counterintuitive to conventional thought and a completely unexpected result.

In particular, preferred electroplating compositions of the invention have a brightener concentration of at least about 1.5 mg per liter of plating solution (1.5 mg/L), more preferably a brightener concentration of at least about 1.75 mg per liter, still more preferably at least about 2.0, 2.5. 3, 3.5 or 4 mg of brightener per liter of plating solution. Good results have been achieved with even higher brightener concentrations, e.g. copper plating baths having a brightener concentration of at least about 5 mg per liter, or at least about 6, 7, 8, 9, 10, 12, 14, 16, 18, 20 or 25 mg/L, or even higher brightener concentrations such as at least about 30, 35, 40, 45, 50, 55 or 60 mg of brightener per liter of plating solution.

Preferably, the brightener concentration is maintained at such high concentrations throughout the entire or at least substantial portion of a plating cycle. Such maintenance of brightener concentrations entails regular addition of brightener during a plating cycle as the brightener component plates out. Brightener concentrations and replenishment rates during a plating cycle can be readily determined by known methods, such as the CPVS method as disclosed in U.S. Pat. Nos. 5,252,196 and 5,223,118, both assigned to the Shipley Company, or by the cyclic voltammetric stripping (CVS) methods.

In addition to such an elevated brightener concentration, preferably the plating bath also contains a surfactant-type suppressor agent. It has been surprisingly found that use of such a suppressor agent in combination with elevated brightener concentrations can result in effective "bottom-fill" copper plating of a microvia or other aperture without defects such as inclusions or voids. In particular, the suppressor enables enhanced plating rate at the bottom of a microvia, permitting copper to plate the entire aperture space in a substantially "bottom-fill" manner, without premature sealing of the aperture top that can result in inclusions or voids.

The invention also includes articles of manufacture, including electronic packaging devices such as printed circuit boards, multichip modules, semiconductor integrated circuits and the like that contain a copper deposit produced from a plating solution of the invention. Other aspects of the invention are discussed infra.

DETAILED DESCRIPTION OF THE INVENTION

Compositions of the invention suitably contain a copper salt, an electrolyte preferably an acidic aqueous solution such as a sulfuric acid solution with a chloride or other halide ion source, and one or more brightener agents in enhanced concentrations as discussed above, and preferably a suppressor agent. The plating compositions also may contain other components such as one or more leveler agents and the like.

As discussed above, electroplating solutions of the invention are particularly effective in plating various articles having microvias with high aspect ratios and small diameters. In particular, solutions of the invention are useful in plating electronic packaging devices such as printed circuit boards, microchip module packaging and blind 3-dimensional structures, particularly semiconductor integrated circuits and other circuit systems. The electroplating solutions of the invention are particularly useful to copper fill microvias of such electronic devices without the defects exhibited upon use of prior chemistries. In addition, the invention has application to plating on a wide variety of other polymer and metal substrates.

Electroplating solutions of the invention generally comprise at least one soluble copper salt, an electrolyte and a brightener component. More particularly, electroplating compositions of the invention preferably contain a copper salt; an electrolyte, preferably an acidic aqueous solution such as a sulfuric acid solution with a chloride or other halide ion source; and one or more brightener agents in enhanced concentrations as discussed above. Electroplating compositions of the invention also preferably contain a suppressor agent. The plating compositions also may contain other components such as one or more leveler agents and the like.

A variety of copper salts may be employed in the subject electroplating solutions, including for example copper sulfates, copper acetates, copper fluoroborate, and cupric nitrates. Copper sulfate pentahydrate is a particularly preferred copper salt. A copper salt may be suitably present in a relatively wide concentration range in the electroplating compositions of the invention. Preferably, a copper salt will be employed at a concentration of from about 10 to about 300 grams per liter of plating solution, more preferably at a concentration of from about 25 to about 200 grams per liter of plating solution, still more preferably at a concentration of from about 40 to about 175 grams per liter of plating solution.

Plating baths of the invention preferably employ an acidic electrolyte, which typically will be an acidic aqueous solution and that preferably contains a halide ion source, particularly a chloride ion source. Examples of suitable acids for the electrolyte include sulfuric acid, acetic acid, fluoroboric acid, methane sulfonic acid and sulfamic acid. Sulfuric acid is generally preferred. Chloride is a generally preferred halide ion. A wide range of halide ion concentrations (if a halide ion is employed) may be suitably utilized, e.g. from about 0 (where no halide ion employed) to 100 parts per million (ppm) of halide ion in the plating solution, more preferably from about 25 to about 75 ppm of halide ion source in the plating solution.

The invention also includes electroplating baths that are substantially or completely free of an added acid and may be neutral or essentially neutral (e.g. pH of at least less than about 8 or 8.5). Such plating compositions are suitably prepared in the same manner with the same components as other compositions disclosed herein but without an added acid. Thus, for instance, a preferred substantially neutral plating composition of the invention may have the same components as the plating bath of Example 1 which follows, but without the addition of sulfuric acid.

As discussed above, it has been discovered that by increasing brightener concentration beyond conventional levels, uniform plating of particularly high aspect ratio microvias and other difficult-to-plate apertures is now possible.

In particular, copper electroplating compositions are provided that have a brightener agent concentration of at least about 1.5 mg per liter of plating solution (1.5 mg/L), compared to typical brightener concentrations ranging from about 0.05 to 1.0 mg/L in prior composition. More preferably, in electroplating baths of the invention, the brightener concentration is at least about 1.75 mg/L, and still more preferably, at least about 2, 2.5, 3, 3.5 or 4 mg/L. Even higher brightener concentrations will be suitable or even preferred, e.g. at least about 10, 15, 20, 30, 40, 50 mg of brightener per liter of plating solution. A brightener concentration of from about 20 to about 200 mg per liter of plating solution will be suitable for many applications.

Preferably, the brightener concentration is maintained throughout the entire electroplating process, or throughout at least a substantial portion of the plating process, e.g. at least about 50, 60, 70, 80 or 90 percent of the duration of the plating process. As discussed above, since brightener levels are depleted as the electroplating progresses, the brightener component is preferably regularly replenished during plating to maintain a steady state brightener concentration.

A wide variety of brighteners, including known brightener agents, may be employed in the copper electroplating compositions of the invention. Typical brighteners contain one or more sulfur atoms, and typically without any nitrogen atoms and a molecular weight of about 1000 or less. Brightener compounds that have sulfide and/or sulfonic acid groups are generally preferred, particularly compounds that comprise a group of the formula R'—S—R—SO$_3$X, where R is an optionally substituted alkyl (which include cycloalkyl), optionally substituted heteroalkyl, optionally substituted aryl group, or optionally substituted heteroalicyclic; X is a counter ion such as sodium or potassium; and R' is hydrogen or a chemical bond (i.e. —S—R—SO$_3$X or substituent of a larger compound). Typically alkyl groups will have from one to about 16 carbons, more typically one to about 8 or 12 carbons. Heteroalkyl groups will have one or more hetero (N, O or S) atoms in the chain, and preferably have from 1 to about 16 carbons, more typically 1 to about 8 or 12 carbons. Carbocyclic aryl groups are typical aryl groups, such as phenyl and naphthyl. Heteroaromatic groups also will be suitable aryl groups, and typically contain 1 to about 3 N, O or S atoms and 1–3 separate or fused rings and include e.g. coumarinyl, quinolinyl, pyridyl, pyrazinyl, pyrimidyl, furyl, pyrrolyl, thienyl, thiazolyl, oxazolyl, oxidizolyl, triazole, imidazolyl, indolyl, benzofuranyl, benzothiazol, and the like. Heteroalicyclic groups typically will have 1 to 3 N, O or S atoms and from 1 to 3 separate or fused rings and include e.g. tetrahydrofuranyl, thienyl, tetrahydropyranyl, piperdinyl, morpholino, pyrrolindinyl, and the like. Substituents of substituted alkyl, heteroalkyl, aryl or heteroalicyclic groups include e.g. C$_{1-8}$ alkoxy; C$_{1-8}$ alkyl, halogen, particularly F, Cl and Br; cyano, nitro, and the like.

More specifically, useful brighteners include those of the following formulae:

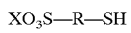
XO$_3$S—R—SH

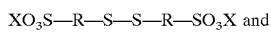
XO$_3$S—R—S—S—R—SO$_3$X and

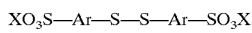
XO$_3$S—Ar—S—S—Ar—SO$_3$X where in the above formulae R is an optionally substituted alkyl group, and preferably is an alkyl group having from 1 to 6 carbon atoms, more preferably is an alkyl group having from 1 to 4 carbon atoms; Ar is an optionally substituted aryl group such as optionally substituted phenyl or naphthyl; and X is a suitable counter ion such as sodium or potassium.

Some specific suitable brighteners include e.g. n,n-dimethyl-dithiocarbamic acid-(3-sulfopropyl)ester; 3-mercapto-propylsulfonic acid-(3-sulfopropyl)ester; 3-mercapto-propylsulfonic acid (sodium salt); carbonic acid-dithio-o-ethylester-s-ester with 3-mercapto-1-propane sulfonic acid (potassium salt); bissulfopropyl disulfide; 3-(benzthiazolyl-s-thio)propyl sulfonic acid (sodium salt); pyridinium propyl sulfobetaine; 1-sodium-3-mercaptopropane-1-sulfonate; sulfoalkyl sulfide compounds disclosed in U.S. Pat. No. 3,778,357; the peroxide oxidation product of a dialkyl amino-thiox-methyl-thioalkanesulfonic acid; and combinations of the above. Additional suitable brighteners are also described in U.S. Pat. Nos. 3,770,598, 4,374,709, 4,376,685, 4,555,315, and 4,673,469, all incorporated herein by reference. Particularly preferred brighteners for use in the plating compositions of the invention are n,n-dimethyl-dithiocarbamic acid-(3-sulfopropyl)ester and bis-sodium-sulfonopropyl-disulfide.

In addition to the copper salts, electrolyte and brightener, plating baths of the invention optionally may contain a variety of other components, including organic additives such as suppressors agents, leveling agents and the like.

As discussed above, use of a suppressor agent in combination with an enhanced brightener concentration is particularly preferred and provides surprisingly enhanced plating performance, particularly in bottom-fill plating of small diameter and/or high aspect ratio microvias.

Without being bound by any theory, it is believed such enhanced bottom-fill plating may occur due to the concentration of the suppressor agent being comparatively decreased at a bottom of a microvia as a result of diffusion effects through the length of the microvia. That reduced suppressor concentration results in an enhanced copper plating rate at the microvia bottom regions.

In contrast, at the surface of the article to be plated (at the top of the microvia), the suppressor agent concentration remains relatively constant and at an elevated level relative to the microvia bottom regions. Consequently, the area at a microvia top has a comparatively suppressed plating rate because of the enhanced suppressor agent concentration relative to the microvia bottom regions.

Preferred suppressor agents for use in the compositions of the invention are polymeric materials, preferably s having hetero atom substitution, particularly oxygen linkages. Generally preferred suppressor agents ate generally high molecular weight polyethers, such as those of the following formula:

R—O—(CXYCX'Y'O)$_n$H where R is an aryl or alkyl group containing from about 2 to 20 carbon atoms; each X, Y, X' and Y' is independently hydrogen; alkyl preferably methyl, ethyl or propyl; aryl such as phenyl; aralkyl such as benzyl, and preferably one or more of X, Y, X' and Y' is hydrogen; and n is an integer between 5 and 100,000. Preferably, R is ethylene and n is greater than 12,000.

More specifically, surfactants useful in the present invention include e.g. amines such as ethoxylated amines, polyoxyalkylene amines and alkanol amines; amides; polyglycol-type wetting agents, such as polyethylene glycols, polyalkylene glycols and polyoxyalkyene glycols; high molecular weight polyethers; polyethylene oxides (mol. wt. 300,000 to 4 million); block copolymers of polyoxyalkyenes; alkylpolyether sulfonates; complexing surfactants such as alkoxylated diamines; and complexing agents for cupric or cuprous ions which include entprol, citric acid, edetic acid, tartaric acid, potassium sodium tartrate, acetonitrile, cupreine and pyridine.

Particularly suitable surfactants for plating compositions of the invention are commercially available polyethylene glycol copolymers, including polyethylene glycol copolymers. Such polymers are available from e.g. BASF (sold by BASF under Tetronic and Pluronic tradenames), and copolymers from Chemax. A butylalcohol-ethylene oxide-propylene oxide copolymer having an M$_w$ of about 1800 from Chemax is particularly preferred.

Surfactants are typically added to copper electroplating solutions in concentrations ranging from about 1 to 10,000 ppm based on the weight of the bath, more preferably about 5 to 10,000 ppm.

Use of one or more leveling agents in plating baths of the invention is generally preferred. Examples of suitable leveling agents are described and set forth in U.S. Pat. Nos. 3,770,598, 4,374,709, 4,376,685, 4,555,315 and 4,673,459. In general, useful leveling agents include those that contain a substituted amino group such as compounds having R—N—R', where each R and R' is independently a substituted or unsubstituted alkyl group or a substituted or unsubstituted aryl group. Typically the alkyl groups have from 1 to 6 carbon atoms, more typically from 1 to 4 carbon atoms. Suitable aryl groups include substituted or unsubstituted phenyl or naphthyl. The substituents of the substituted alkyl and aryl groups may be, for example, alkyl, halo and alkoxy.

More specifically, suitable leveling agents include e.g. 1-(2-hydroxyethyl)-2-imidazolidinethione; 4-mercaptopyridine; 2-mercaptothiazoline; ethylene thiourea; thiourea; alkylated polyalkyleneimine; phenazonium compounds disclosed in U.S. Pat. No. 3,956,084; N-heteroaromatic rings containing polymers; quaternized, acrylic, polymeric amines; polyvinyl carbamates; pyrrolidone; and imidazole. A particularly preferred leveler is 1-(2-hydroxyethyl)-2-imidazolidinethione. Typical concentrations of leveling agents range from about 0.05 to 0.5 mg per liter of plating solution.

The copper electroplating compositions are suitably used in similar manner as prior copper electroplating baths, except an elevated brightener concentration is employed and preferably maintained at an elevated level throughout a plating cycle.

For instance, with reference to a printed circuit board substrate, a copper clad plastic substrate is typically employed, e.g. a copper clad glass fiber reinforced epoxy panel. Prior to formation of a circuit, apertures, such as microvias, are formed in the board by drilling and metallization. Microvias and other apertures also may be formed by photoimaging. Processes for forming such apertures in electronic device substrates are known and are disclosed e.g. in U.S. Pat. No. 4,902,610; C. Coombs, *Printed Circuits Handbook*, (4$^{th}$ed., McGraw Hill); and T. Kiko, *Printed Circuit Board Basics* (PMS Indus.).

After formation of the microvia or other aperture, electroless plating procedures are then used to form a first metallic coating over the substrate surfaces and electrolytic copper deposition is then used to enhance the thickness of the coating. Alternatively, electrolytic copper may be plated directly over a suitably prepared microvia as disclosed in any of U.S. Pat. Nos. 5,425,873; 5,207,888; and 4,919,768. The next step in the process comprises electroplating copper onto the thus prepared conductive microvias using an electroplating solution of the invention.

Plating baths of the invention are preferably employed at or above room temperature, e.g. up to and somewhat above 65° C. The plating composition is preferably agitated during use such as by air sparger, work piece agitation, impingement or other suitable method. Plating is preferably conducted at a current ranging from 1 to 40 ASF depending upon substrate characteristics. Plating time may range from about 5 minutes to 1 hour or more, depending on the difficulty of the work piece. See generally the examples which follow for exemplary preferred procedures.

A wide variety of substrates may be plated with the compositions of the invention, as discussed above. The compositions of the invention are particularly useful to plate difficult work pieces, such as circuit board substrates with small diameter, high aspect ratio microvias and other apertures. The plating compositions of the invention also will be particularly useful for plating integrated circuit devices, such as formed semiconductor devices and the like. See the examples which follow for exemplary substrates plated in accordance with the invention.

As discussed above, aspect ratios of at least 4:1, having diameters of about 200 nm or smaller have been effectively copper plated with no defects (e.g. no voids or inclusions by ion beam examination) using plating solutions of the invention. Microvias with diameters below 150 nm, or even below about 100 nm, and aspect ratios of 5:1, 6:1, 7:1, 10:1 or greater, and even up to about 15:1 or greater can be effectively plated (e.g. no voids or inclusions by ion beam examination) using plating solutions of the invention.

All documents mentioned herein are fully incorporated herein by reference. The following non-limiting examples are illustrative of the invention.

EXAMPLE 1

A preferred copper electroplating bath of the invention was prepared by admixing the following components in water. In the composition the brightener was bis-sodium-sulfonopropyl-disulfide and the suppressor was a polyethylene glycol polymer sold under the tradename PEG 8000 by Union Carbide.

| Component | Concentration |
|---|---|
| $CuSO_4 5H_2O$ | 60 g/l |
| $H_2SO_4$ | 225 g/l |
| Cl | 50 ppm |
| Suppressor | 1 g/l |
| Brightener | 2.1 mg/l |

Through hole walls of a printed circuit board substrate and microvias were plated as follows with the above plating composition. An air-agitated plating tank outfitted with multiple cathode rails and one rectifier was charged with the above copper plating solution. During plating, the following deposition conditions were employed: current density of 14.5 mA/cm$^2$; waveform was DC; temperature plating bath was 25° C. After termination of the plating procedure, a microvia of the board substrate was examined. It was found that copper completely filled the microvia walls to provide a smooth uniform copper plate with no voids.

EXAMPLE 2

A further preferred copper electroplating bath of the invention was prepared by admixing the following components in water. In the composition the brightener was bis-sodium-sulfonopropyl-disulfide and the suppressor was a propylene glycol copolymer sold under the tradename L62D by BASF.

| Component | Concentration |
|---|---|
| $CuSO_4 5H_2O$ | 70 g/l |
| $H_2SO_4$ | 175 g/l |
| Cl | 50 ppm |
| Suppressor | 0.875 g/l |
| Brightener | 2.4 mg/l |

200 nm with 7:1 aspect ratio microvias of a back end of the line semiconductor microchip wafer were plated using the above plating composition. The wafer was electrically attached to a cathode and the plating solution was pumped onto the surface of the wafer while rotating at upwards of 200 RPM. Electrical current of 14.5 mA/cm$^2$ was applied with DC wave form at 25° C. After termination of the plating procedure, the microvias were filled with no defects as determined by focused ion beam examination.

EXAMPLE 3 (COMPARATIVE EXAMPLE)

A further preferred copper electroplating bath of the invention was prepared by admixing the following components in water. In the composition the brightener was bis-sodium-sulfonopropyl-disulfide and the suppressor was a propylene glycol copolymer sold under the tradename L62D by BASF.

| Component | Concentration |
|---|---|
| $CuSO_4 5H_2O$ | 60 g/l |
| $H_2SO_4$ | 225 g/l |
| Cl | 50 ppm |
| Suppressor | 1 g/l |
| Brightener | 0.35 mg/l |

200 nm with 4:1 aspect ratio microvias of a semiconductor microchip wafer were plated using the above comparative plating composition under conditions as described in Example 2. After termination of the plating procedure, the microvias were examined by scanning electron microscopy (SEM) and focused ion beam examination. Those examinations showed the copper deposits in the microvias contained defects of voids, seams and inclusions.

The foregoing description of the invention is merely illustrative thereof, and it is understood that variations and modifications can be effected without departing from the scope or spirit of the invention as set forth in the following claims.

What is claimed:

1. A method for plating a semiconductor microchip wafer substrate, comprising:
   electrolytically depositing copper onto said semiconductor microchip wafer substrate from an electroplating composition that comprises at least one soluble copper salt, an electrolyte, and one or more brightener compounds having a molecular weight of about 1000 or less and that are present in a concentration of at least about 1.5 mg per liter of the electroplating solution, the microchip wafer substrate comprising one or more microvias having an aspect ratio of at least 4:1 and a diameter of about 200 nm or less.

2. The method of claim 1 wherein the brightener concentration is at least about 2 mg per liter of the electroplating solution.

3. The method of claim 2 wherein the composition further comprises a suppressor agent.

4. The method of claim 3 wherein the suppressor agent is a polyether.

5. The method of claim 2 wherein the electroplating composition comprises a halide ion source.

6. The method of claim 5 wherein the halide ion source is present in a concentration of from about 25 to about 75 ppm of the electroplating composition.

7. The method of claim 2 wherein the electroplating composition comprises a halide ion source.

8. The method of claim 7 wherein the halide ion source is present in a concentration of from about 25 to about 75 ppm of the electroplating composition.

9. The method of claim 2 wherein the electroplating composition is acidic.

10. The method of claim 9 wherein the electroplating composition comprises sulfuric acid or methane sulfonic acid.

11. The method of claim 1 wherein the brightener concentration is at least about 3 mg per liter of the electroplating solution.

12. The method of claim 11 wherein the composition further comprises a suppressor agent.

13. The method of claim 12 wherein the suppressor agent is a polyether.

14. The method of claim 11 wherein the electroplating composition comprises a halide ion source.

15. The method of claim 14 wherein the halide ion source is present in a concentration of from about 25 to about 75 ppm of the electroplating composition.

16. The method of claim 1 wherein the brightener concentration is at least about 4 mg per liter of the electroplating solution.

17. The method of claim 16 wherein the brightener concentration is at about 3 mg per liter throughout at least about 70 percent of the duration of plating of the substrate.

18. The method of claim 16 wherein the electroplating composition is acidic.

19. The method of claim 18 wherein the electroplating composition comprises sulfuric acid or methane sulfonic acid.

20. The method of claim 1 wherein the brightener concentration is at least about 5 mg per liter of the electroplating solution.

21. The method of claim 1 wherein the brightener concentration is at least about 6 mg per liter of the electroplating solution.

22. The method of claim 21 wherein the brightener concentration is at about 6 mg per liter throughout at least about 70 percent of the duration of plating of the substrate.

23. The method of claim 1 wherein the brightener concentration is at least about 8 mg per liter of the electroplating solution.

24. The method of claim 1 wherein the brightener concentration is at least about 10 mg per liter of the electroplating solution.

25. The method of claim 24 wherein the one or more brightener compounds are present in a concentration of up to 20 mg per liter of the electroplating composition.

26. The method of claim 1 wherein the brightener concentration is at least about 15 mg per liter of the electroplating solution.

27. The method of claim 26 wherein the one or more brightener compounds are present in a concentration of up to 20 mg per liter of the electroplating composition.

28. The method of claim 1 wherein the brightener concentration is at about 1.5 mg per liter throughout at least about 70 percent of the duration of plating of the substrate.

29. The method of claim 1 wherein copper is deposited to fill the one or more microvias to provide a copper plate in the absence of voids or inclusions.

30. The method of claim 1 wherein the composition further comprises a suppressor agent.

31. The method of claim 30 wherein the suppressor agent is a polyether.

32. The method of claim 1 wherein the electroplating composition comprises a halide ion source.

33. The method of claim 1 wherein the electroplating composition is acidic.

34. The method of claim 33 wherein the electroplating composition comprises sulfuric acid or methane sulfonic acid.

35. The method of claim 1 wherein the one or more brightener compounds are present in a concentration of up to 10 mg per liter of the electroplating composition.

36. The method of claim 1 wherein the one or more brightener compounds are present in a concentration of up to 20 mg per liter of the electroplating composition.

37. The method of claim 1 wherein the one or more microvias have an aspect ratio of about 5:1 or greater.

38. The method of claim 1 wherein the one or more microvias have an aspect ratio of about 10:1 or greater.

39. A method for plating on a semiconductor substrate comprising one or more microvias, comprising:

electrolytically depositing copper onto said semiconductor substrate from an acidic electroplating composition that comprises at least one soluble copper salt, an electrolyte, one or more brightener compounds having a molecular weight of about 1000 or less and that are present in a concentration of at least 2 mg per liter of the electroplating composition, a suppressor agent, and a halide ion source, semiconductor substrate comprising one or more microvias having an aspect ratio of at least 4:1 and a diameter of about 200 nm or less.

40. The method of claim 39 wherein the suppressor agent is a polyether.

41. The method of claim 39 wherein the brightener concentration is at least about 3 mg per liter of the electroplating solution.

42. The method of claim 41 wherein the brightener concentration is at about 6 mg per liter throughout at least about 70 percent of the duration of plating of the substrate.

43. The method of claim 39 wherein the brightener concentration is at least about 6 mg per liter of the electroplating solution.

44. The method of claim 39 wherein the brightener concentration is at about 2 mg per liter throughout at least about 70 percent of the duration of plating of the substrate.

45. The method of claim 39 wherein the one or more brightener compounds are present in a concentration of up to 10 mg per liter of the electroplating composition.

46. The method of claim 39 wherein the one or more brightener compounds are present in a concentration of up to 20 mg per liter of the electroplating composition.

* * * * *